United States Patent [19]

Szekely et al.

[11] Patent Number: 5,196,085
[45] Date of Patent: Mar. 23, 1993

[54] ACTIVE MAGNETIC FLOW CONTROL IN CZOCHRALSKI SYSTEMS

[75] Inventors: Julian Szekely, Weston; Olusegun J. Ilegbusi, Sharon, both of Mass.

[73] Assignee: Massachusetts Institute of Technology, Cambridge, Mass.

[21] Appl. No.: 635,947

[22] Filed: Dec. 28, 1990

[51] Int. Cl.⁵ .............................. C30B 15/00
[52] U.S. Cl. .................... 156/617.1; 156/607; 156/618.1; 156/619.1; 422/249
[58] Field of Search .................. 156/607, 617.1, 618.1, 156/619.1; 422/249

[56] References Cited

U.S. PATENT DOCUMENTS

| | | | |
|---|---|---|---|
| 3,074,785 | 1/1963 | Gremmelmaier | 422/249 |
| 3,607,139 | 9/1971 | Hanks | 422/249 |
| 4,594,173 | 6/1986 | Hobgood et al. | 252/62.36 A |
| 4,619,730 | 10/1986 | Suzuki et al. | 156/617.1 |
| 4,622,211 | 11/1986 | Suzuki et al. | 422/248 |
| 4,637,854 | 1/1987 | Fukuda et al. | 156/607 |
| 4,659,423 | 4/1987 | Kim et al. | 156/617.1 |
| 4,708,764 | 11/1987 | Boden et al. | 422/249 |
| 4,783,235 | 11/1988 | Morioka et al. | 156/620.4 |
| 4,818,500 | 4/1989 | Boden et al. | 422/249 |
| 4,830,703 | 5/1989 | Matsutani | 422/249 |
| 4,849,065 | 7/1989 | Ohkubo et al. | 156/617.1 |

FOREIGN PATENT DOCUMENTS

| | | |
|---|---|---|
| 1253421 | 9/1985 | Canada . |
| 174003 | 3/1986 | European Pat. Off. . |
| 3701733 | 8/1988 | Fed. Rep. of Germany . |
| 3701811 | 8/1988 | Fed. Rep. of Germany . |
| 257652 | 6/1988 | German Democratic Rep. . |
| 263310 | 12/1988 | German Democratic Rep. . |
| 263312 | 12/1988 | German Democratic Rep. . |
| 0081086A | 7/1983 | Japan . |
| 59-073491 | 4/1984 | Japan . |
| 60-033287 | 2/1985 | Japan . |
| 60-033291 | 2/1985 | Japan . |
| 60-033294 | 2/1985 | Japan . |
| 60-051689 | 3/1985 | Japan . |
| 60-051690 | 3/1985 | Japan . |
| 61-014193 | 1/1986 | Japan . |
| 61-222983 | 10/1986 | Japan . |
| 61-222984 | 10/1986 | Japan . |
| 61-222985 | 10/1986 | Japan . |
| 61-251594 | 11/1986 | Japan . |
| 62-059596 | 3/1987 | Japan . |
| 62-235291 | 10/1987 | Japan . |
| 62-275089 | 11/1987 | Japan . |
| 62-275099 | 11/1987 | Japan . |
| 63-060191 | 3/1988 | Japan . |
| 63-060192 | 3/1988 | Japan . |
| 63-060193 | 3/1988 | Japan . |
| 63-085085 | 4/1988 | Japan . |
| 2109267A | 10/1981 | United Kingdom . |
| 2144338A | 3/1986 | United Kingdom . |
| 2182262 | 5/1987 | United Kingdom . |
| 2191112 | 12/1987 | United Kingdom . |
| 2191113A | 12/1987 | United Kingdom . |
| 2191113 | 12/1987 | United Kingdom . |

OTHER PUBLICATIONS

"Recent Advances and Future Directions in CZ-Silicon Crystal Growth Technology", Fiegl, Solid State Technology, 26, 121, (1983).

"Qualitative Effects of Oscillating Magnetic Fields on Crystal Melts", Miller, Journal of Crystal Growth, 20, 310, (1973).

"Combination Heater-Magnetic Solenoid Coil(s) for Suppressing Melt Convection in Crystal Growth", Giess et al., IBM Technical Disclosure Bulletin, 26, 4716 (1984).

"The Effect of Externally Imposed Magnetic Fields on Forced Convection in Czochralski Crystal Growing Systems", Cartwright et al., Journal of Metals, 37, 113, (1985).

(List continued on next page.)

*Primary Examiner*—Robert Kunemund
*Assistant Examiner*—Felisa Garrett
*Attorney, Agent, or Firm*—Choate, Hall & Stewart

[57] ABSTRACT

Improved Czochralski crystal growth apparatuses with bulk melt electromagnetic stirring and external axial magnetic fields selectively applied to a melt/growing crystal interface are provided. Such apparatuses are particularly well-suited for continuous feed growth processes.

7 Claims, 3 Drawing Sheets

OTHER PUBLICATIONS

"Mass Transport in a Czochralski Crystal Puller with an Axial Magnetic Field: Melt Motion Due to Crystal Growth and Buoyancy", Hjellming et al., Journal of Crystal Growth, 92, 371, (1988).

"Isothermal Motion in a Liquid-Encapsulated Czochralski Crystal Puller with an Axial Magnetic Field", Hjellming et al., Physico Chemical Hydrodynamics, 10, 107, (1988).

"Effect of Co-Rotation and Counter Rotation on Suppression of Melt Convection in Magnetic Czochralski Growth", Lee et al., Journal of Crystal Growth, 84, 669, (1987).

"Effects of an External Magnetic Field on Solute Distribution in Czochralski Grown Crystals—A Theoretical Analysis", Kobayashi, Journal of Crystal Growth, 75, 301, (1986).

"Melt Motion in a Czochralski Crystal Puller with an Axial Magnetic Field: Isothermal Motion", Hjellming et al., Journal of Fluid Mechanics, 164, 237, (1986).

"Study of Thermal Symmetry in Czochralski Silicon Melt under a Vertical Magnetic Field", Hirata et al., Japanese Journal of Applied Physics, 23, L527, (1984).

"Digital Simulation of Magnetic Czochralski Flow under Various Laboratory Conditions for Silicon Growth", Langlois et al., IBM J. Res. Develop., 27, 281, (1983).

"Czochralski Silicon Crystal Growth in the Vertical Magnetic Field", Hoshikawa, Japanese Journal of Applied Physics, 21, L545, (1982).

"Dynamics of Liquid-Encapsulated Czochralski Growth of Gallium Arsenide: Comparing Model with Experiment", Thomas et al., Journal of Crystal Growth, 96, 135, (1989).

"Computer Simulation of Czochralski Melt Convention in a Magnetic Field", Langlois, Journal of Crystal Growth, 70, 73, (1984).

"The Effect of an External Magnetic Field on Natural Convection during the Crystal Growth Process from a Melt", Munakata et al., Nippon Kikai Gakkai Ronbunshu, 54, 505, (1988).

"Biasing of Electrical Potential for Enhancement of Magnetic Czochralski Crystal Growth", Disclosed Anonymously, Research Disclosure, 274, 104, (1987).

"Effect of Thermoelectromagnetic Convection on the Production of Bulk Single-Crystals Consisting of Semiconductor Melts in a Constant Magnetic Field", Gorbunov, Magnetohydrodynamics, 23, 349, (1987).

"Effects of an External Magnetic Field on Solute Distribution in Czochralski Grown Crystals—A Theoretical Analysis", Sumio, Journal of Crystal Growth, 75, 301, (1986).

"Heat Transfer Problems Relating to Marangoni Convection", Tanasawa et al., Heat Transfer in High Technology and Power Engineering, 39, (1987).

"Growth of Crystals under the Influence of Applied Fields", Cochran, IEEE Southeastcon, 1, 46, (1987).

ACTIVE MAGNETIC FLOW CONTROL IN CZOCHRALSKI SYSTEMS

BACKGROUND OF THE INVENTION

The invention relates to Czochralski crystal growth apparatus.

The Czochralski (CZ) method is a standard technique for growth of single crystal silicon, gallium arsenide, and related semiconductor materials as well as oxide and sulfide optical and electronic materials.

According to the Czochralski method, a melt is contained in a rotatable, heated crucible and a rotating seed crystal is gradually withdrawn, resulting in the growth of a single crystal of the desired composition. Careful manipulation of temperature gradients at a melt-crystal interface enables growth of single crystalline rather than polycrystalline material.

Key objectives of this crystal growth process are:
(1) production of low defect level crystals;
(2) production of uniformly doped crystals; and
(3) optimization of crystal productivity.

In practice, several problems arise in Czochralski growth. Many of these difficulties are associated with the unsteady nature of the process where melt depletion changes the nature of the circulation system, as well as the heat loss rate.

These systems have been extensively modelled mathematically and there appears to be a consensus that, under ideal operating conditions, forced flow in the melt (due to crystal and crucible rotation) is carefully balanced by natural convective or buoyancy driven flow, produced by heated crucible walls. Further, in this ideal case, forced flow overwhelms natural convection in the bulk.

Another important problem encountered in the operation of Czochralski systems is onset of highly undesirable oscillatory flow behavior, which occurs particularly for large scale systems and manifests itself by the establishment of periodically changing flow patterns.

One way of combatting flow instabilities and oscillatory flow behavior, while promoting uniform dopant distribution, has been imposition of either an axial or a horizontal magnetic field, having strength typically in the few hundred Gauss to the few thousand Gauss range.

Vertical magnetic fields are useful for stabilizing flow; however, they suppress convective heat transport from crucible wall to bulk melt, thereby reducing the crystal production rate by as much as a factor of two.

Horizontal magnetic fields do not interfere with heat transfer from the crucible walls to the melt; however, they may introduce spatial non-uniformities in the dopant distribution .

In conventional CZ systems, including those with magnetic damping, the buoyancy driven flow (in the vicinity of the walls) cannot be controlled independently of the heating rate; furthermore, the buoyancy driven flow varies very markedly as the melt is depleted.

SUMMARY OF THE INVENTION

The invention provides Czochralski crystal growth apparatuses which control flow within the melt such that flow instabilities and radial flow non-uniformities are eliminated, while adequate convective heat transfer is assured between the vertical crucible walls and the melt.

Furthermore, according to the invention, a Czochralski crystal growth apparatus includes crystal precursor material contained within a heated vessel which may be heated by a resistance heater and induction coils capable of readily controllable rotational or vertical recirculation generation in the melt. These fields balance, overwhelm, or minimize buoyancy-driven flow near vessel walls, depending upon the specific system design Electromagnetic stirring for enhanced convection in the bulk and near the crucible walls is combined with the stabilizing effect of an externally imposed axial (cusp) magnetic force field applied in the vicinity of the melt-crystal interface. A seed crystal is withdrawn to initiate crystal growth According to the invention, a CZ growing system is provided with stirring by electromagnetic coils in the bulk melt and an axial magnetic field (cusp field) in the vicinity of the melt-crystal interface, to ensure laminar flow and quiescent conditions in this region. The invention provides a fully controllable flow field and agitation in the bulk melt, while insuring quiescent conditions at the melt-solid interface.

In various embodiments, melt stirring can be accomplished magnetically by inducing either rotational motion, with a rotating field or vertical motion with a travelling field. By controlling the flow in the bulk and in the vicinity of the walls, the heat transfer rate from the walls to the melt and mass transfer between the free surface of the melt and the surroundings can be controlled. Heat and mass transfer control can strongly affect oxygen incorporation in silicon crystals.

The invention suppresses flow instabilities and oscillations at the melt-crystal interface vicinity and provides an independently controllable flow pattern in the bulk melt and at the melt-crucible interface. In this way, the heat transfer coefficient between the melt and crucible surface is precisely controlled and the change in flow conditions resulting from melt depletion is readily compensated.

The growth of good quality crystals at high production rates requires apparatuses which provide adequate convective heat transfer while they suppress convective instabilities. This capability is particularly important for continuous Czochralski growth systems where molten or solid materials are continuously fed into the apparatus. The sensitive solidification interface must be protected from disturbances created when material is fed into the melt in this fashion; however, stirring of the melt is essential to fully dissolve new feed material.

The Czochralski crystal growth system of the invention is ideally suited to a continuous feed process since it combines electromagnetic stirring with application of an axial field localized at the solidification interface to simultaneously provide stirring as a dissolution aid for material newly fed into the melt while protecting the solidification interface from disturbance.

DESCRIPTION OF THE PREFERRED EMBODIMENT

Fluid flow in Czochralski crystal growth apparatus can be controlled and optimized with electromagnetic stirring combined with selective application of external axial fields at the solidification interface.

Figure 1:
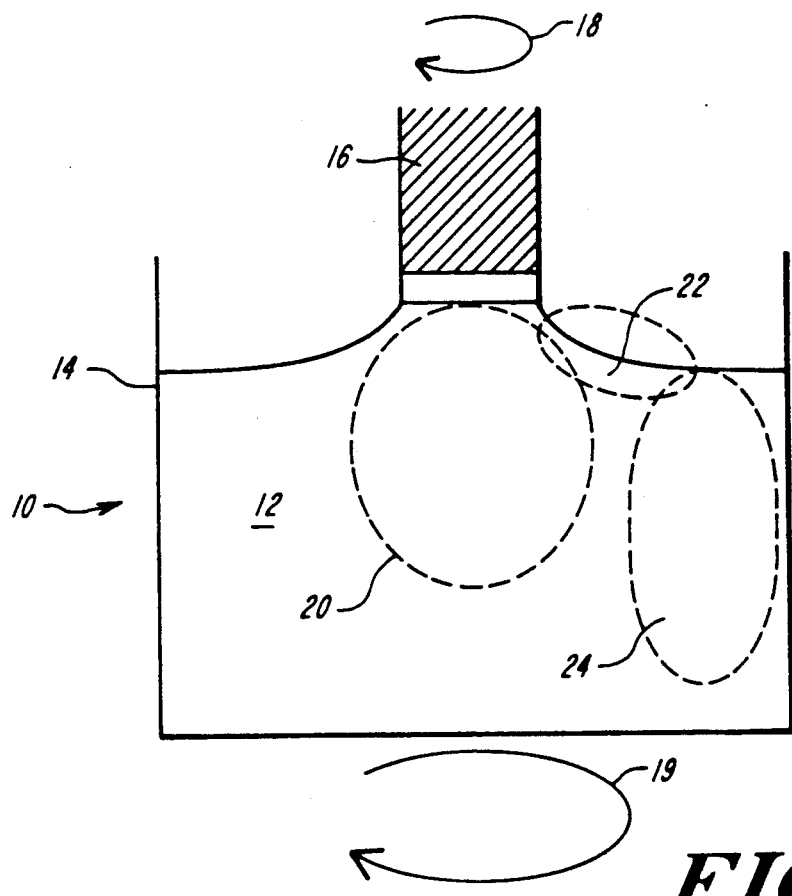
FIG. 1 is a schematic illustration of a Czochralski crystal growth system without electromagnetic stirring or an externally applied magnetic field.

FIG. 1 shows fluid flow patterns which prevail in a Czochralski crystal growth apparatus without any electromagnetic stirring or applied external magnetic fields In Czochralski crystal growth apparatus 10, melt 12 is contained within crucible 14 and crystal 16 is rotated in a direction given by upper arrow 18. Crucible 14 is rotated in a direction given by lower arrow 19. Within melt 12, forced fluid flow indicated by pattern 20, surface tension driven flow indicated by pattern 22 and natural convection indicated by fluid flow pattern 24 coexist. Surface tension driven flow 22 and natural convection driven flow 24 are responsible for impurity transfer.

Figure 2:
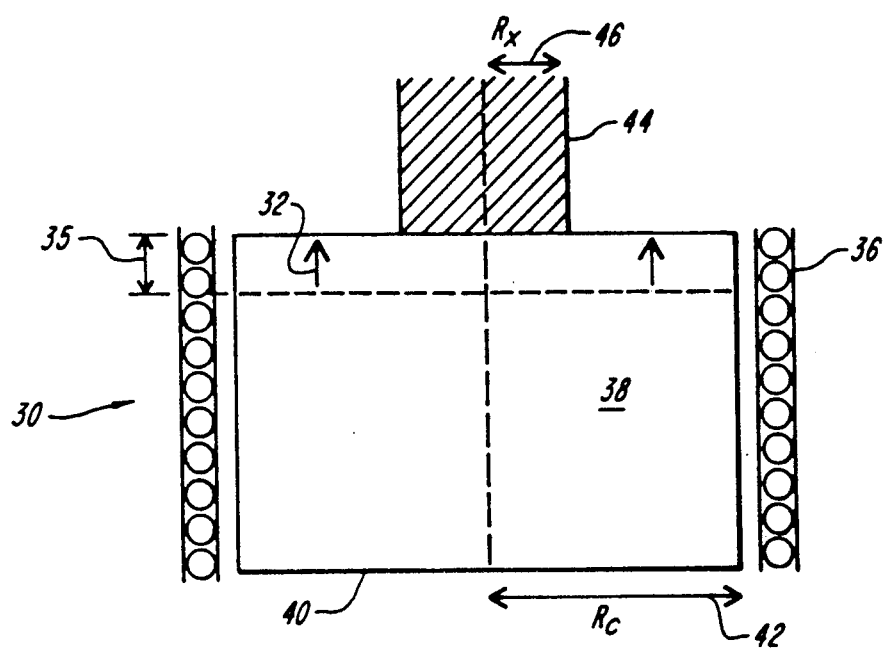
FIG. 2 is a schematic illustration of an inductively stirred Czochralski crystal growth system with an axial magnetic field imposed selectively in the vicinity of the growing crystal.

In FIG. 2, a Czochralski crystal growth system 30 is shown wherein a stationary external magnetic field, $B_o$, whose axial upward or downward direction is indicated by arrow 32 is applied selectively at growing crystal surface vicinity 35 in combination with a moving magnetic field provided by induction coils 36 which also act as heaters. The moving magnetic field serves to stir melt 38 contained within crucible 40 characterized by radius, $R_c$ 42, while applied external stationary axial magnetic field, $B_o$, damps disturbances in crystal surface vicinity 35 as growing crystal 44 characterized by radius, $R_x$ 46, is withdrawn from melt 38.

The damping force exerted by the electromagnetic stirring and externally applied field is given by:

$$F = J \times B.$$

In a preferred embodiment, a cusp field is imposed in the vicinity of melt-crystal interface 35 which ranges from approximately 500-5,000 Gauss or 0.05-0.5 tesla. For maximum effect, this field should not extend very deeply into the melt, with a desired penetration of approximately 10-20% of melt depth.

Stirring forces are in the $10-10^6$ N/m$^3$ range. Continuous adjustment of these stirring forces is possible to optimize the performance of the system.

Czochralski system 30 is particularly attractive as a continuous feed Czochralski growth system since fresh, unmelted feed material can be introduced into the system in the agitated zone where a moving magnetic field stirs the melt, while the effect of this disturbance is minimized at crystal surface vicinity 35 by damping from external stationary magnetic field $B_o$.

Figure 3:
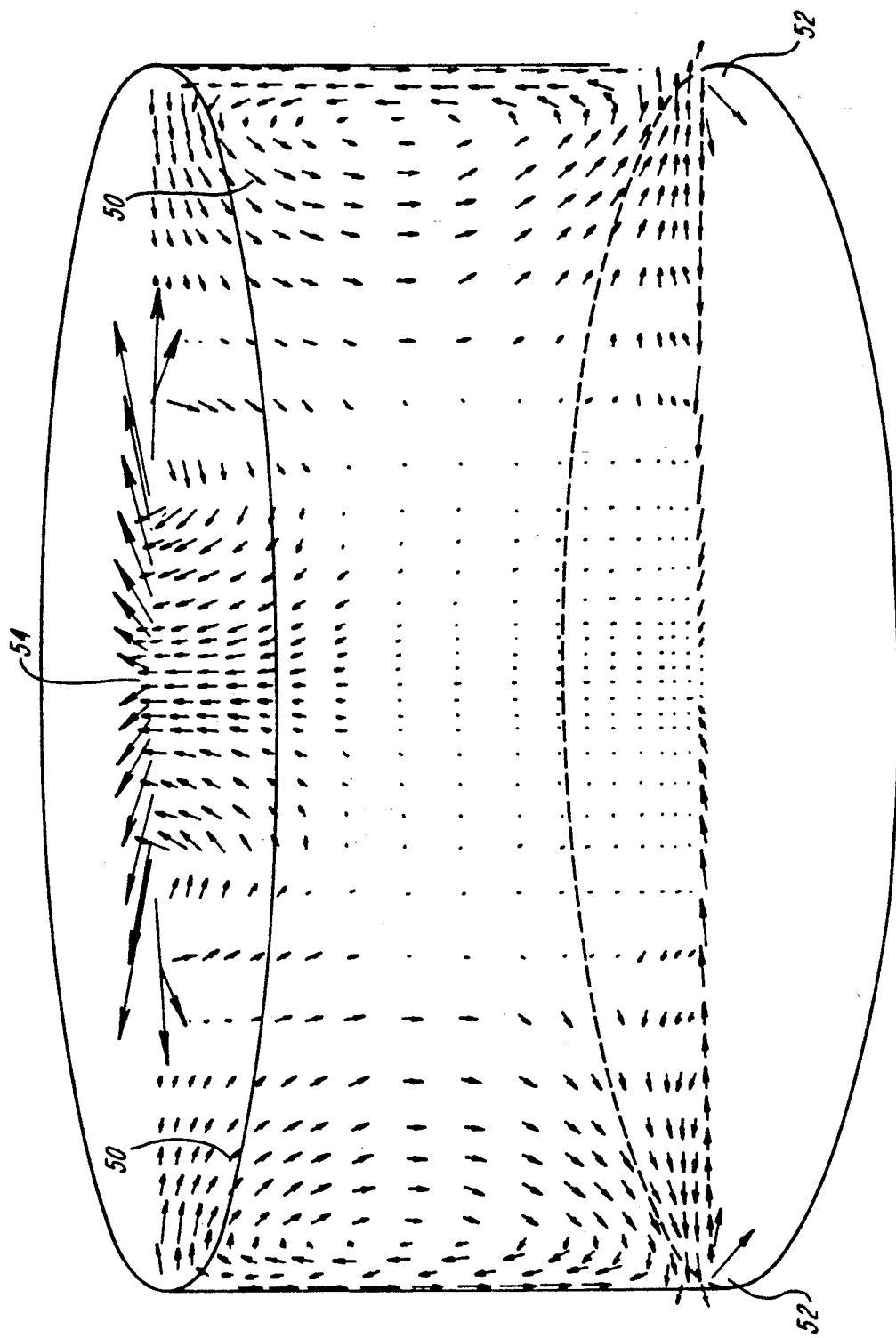
FIG. 3 is a representation of computer simulation results for fluid flow in a Czochralski system with a crystal rotation rate of 60 rpm and no induction stirring or externally applied magnetic field.
Figure 4:
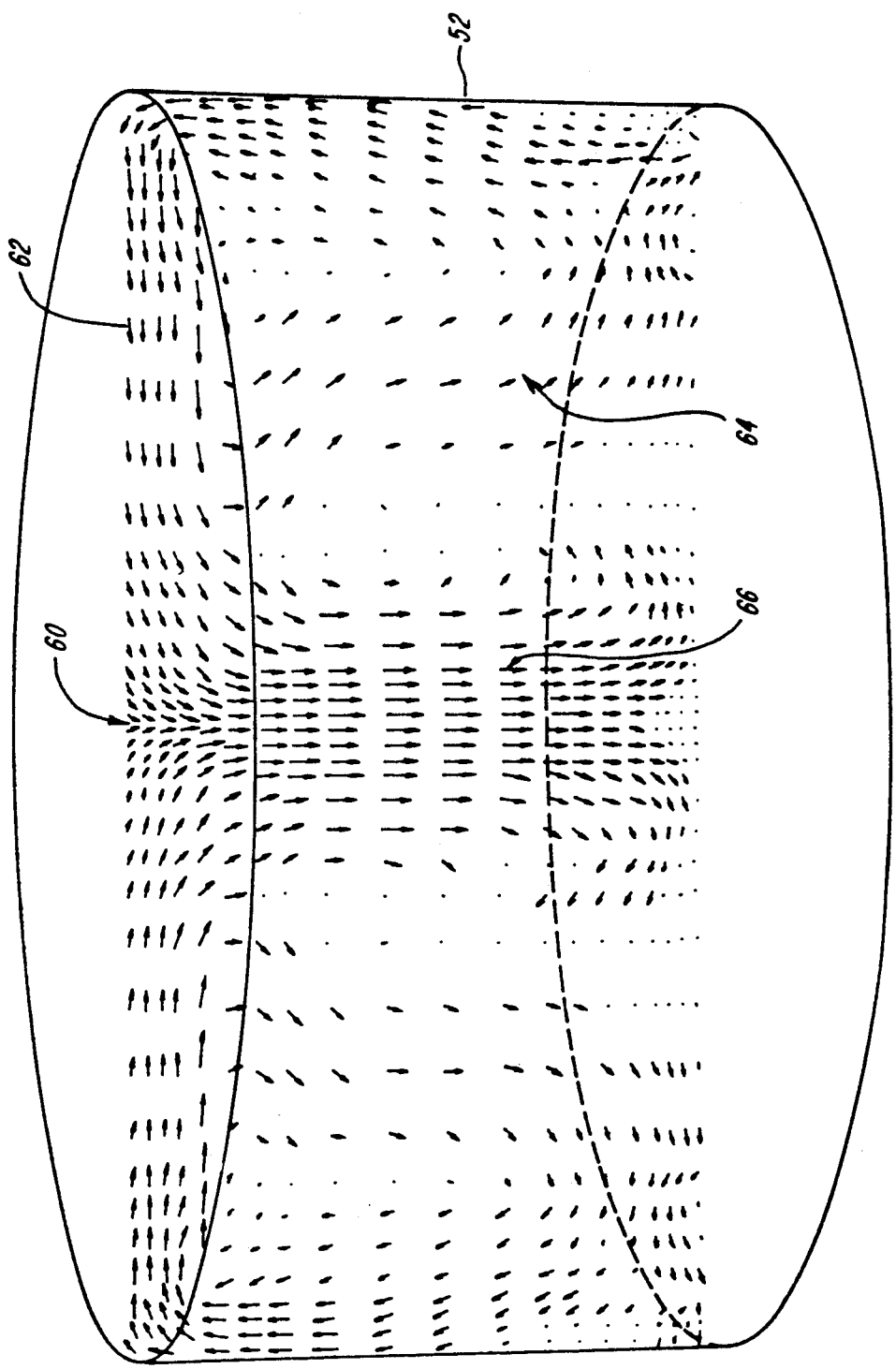
FIG. 4 is a representation of computer simulation results showing velocity vectors for fluid flow in the presence of induction stirring with a 1 kiloGauss axial magnetic field selectively imposed in the vicinity of the growing crystal, a crystal rotation rate of 60 rpm and a 300 A coil current.

FIGS. 3 and 4 represent fluid flow patterns calculated using a computer model which relies on the simultaneous solution of Maxwell's equations, the Navier-Stokes equations, and the differential thermal energy balance equation for particular rotating and externally applied axial magnetic field configurations. These calculations have been performed for a stationary crucible; however, the results are equally applicable to systems incorporating crucible rotation.

FIG. 3 shows the computed circulation pattern in a Czochralski crystal growth system without electromagnetic stirring or an imposed magnetic field. Velocity vectors (0.005 m/s) 50 indicate marked upward flow due to buoyancy in the vicinity of crucible walls 52, corresponding to the natural convection circulation pattern 24 shown in FIG. 1. Velocity vectors represent circulation pattern 54.

In a preferred embodiment of a Czochralski crystal growth apparatus, the melt can be electromagnetically stirred, while a magnetic field is selectively imposed in the vicinity of the melt/crystal interface. A possible pattern 60 expected in such a system is shown in FIG. 4. It is evident from the calculated flow fields shown in FIG. 4 that buoyancy and forced flow are somewhat suppressed in the vicinity of the melt-crystal interface as shown by velocity vectors (0.005 m/s) 62 and pattern 60. Furthermore, velocity vectors 64 and 66 indicate the presence of quite strong convection in the bulk of the melt.

What is claimed is:

1. An apparatus for Czochralski crystal growth comprising:
   a crystal precursor material;
   a container for said material;
   a heater;
   induction coils for imposition of a magnetic field within said material for controlling a recirculation motion;
   a withdrawal seed crystal; and
   a magnetic field generator for imposition of an external axial magnetic field separate from said field applied by said induction coils in the vicinity of a melt/crystal interface, whereby laminar flow and quiescent conditions are established in said vicinity.

2. The apparatus of claim 1 wherein said induction coils are in a multiphase or single phase arrangement.

3. The apparatus of claim 1 wherein said crystal precursor material is any conducting or semiconducting material.

4. The apparatus of claim 1 further providing for coverage of said molten material by a liquid encapsulant.

5. The apparatus of claim 1 wherein said heater is a resistance heater.

6. The apparatus of claim 1 wherein said induction coils generate rotational recirculation motion in the melt.

7. The apparatus of claim 1 wherein said induction coils generate vertical recirculation motion in the melt.

* * * * *

UNITED STATES PATENT AND TRADEMARK OFFICE
CERTIFICATE OF CORRECTION

PATENT NO. : 5,196,085
DATED : March 23, 1993
INVENTOR(S) : Julian Szekely and Olusegun J. Hegbusi It is certified that error appears in the above-indentified patent and that said Letters Patent is hereby corrected as shown below:

Column 2, line 10: after "design" please insert --.--; and

Column 3, line 55: delete "10" and insert therefor $--10^4--$.

Signed and Sealed this

Twenty-eighth Day of December, 1993

Attest:

BRUCE LEHMAN

*Attesting Officer*     *Commissioner of Patents and Trademarks*